United States Patent [19]
Jang

[11] Patent Number: 5,557,218
[45] Date of Patent: Sep. 17, 1996

[54] REPROGRAMMABLE PROGRAMMABLE LOGIC ARRAY

[75] Inventor: Hyun S. Jang, Kyoungki-do, Rep. of Korea

[73] Assignee: Hyundai Electronics Industries Co., Ltd., Kyoungki-do, Rep. of Korea

[21] Appl. No.: 501,819

[22] Filed: Jul. 13, 1995

[30] Foreign Application Priority Data

Jul. 14, 1994 [KR] Rep. of Korea .................. 94-16969

[51] Int. Cl.6 .................................................. H03K 7/38
[52] U.S. Cl. ............................................................ 326/40
[58] Field of Search ........................................ 326/40.39

[56] References Cited

U.S. PATENT DOCUMENTS

| | | | |
|---|---|---|---|
| 4,336,601 | 6/1982 | Tanaka | 326/40 |
| 4,348,737 | 9/1982 | Cukier et al. | 326/40 |
| 4,730,130 | 3/1988 | Baskett | 326/40 |
| 4,791,603 | 12/1988 | Henry | 326/40 |

*Primary Examiner*—Edward P. Westin
*Assistant Examiner*—Richard Roseen
*Attorney, Agent, or Firm*—Popham, Haik, Schnobrich & Kaufman, Ltd.

[57] ABSTRACT

A reprogrammable programmable logic array comprising a first write module for inputting data to be written and data to be compared, an AND CAM cell array block for, in a write mode, sequentially storing the write data from the first write module and, in a match mode, comparing the comparison data from the first write module with its pre-stored data and generating match signals in accordance with the compared result, a first address module for, in the write mode, generating sequential addresses and supplying the generated sequential addresses to the AND CAM cell array block, a second write module for inputting data to be written in the write mode, an OR CAM cell array block for storing sequentially the write data from the second write module in the write mode and detecting its pre-stored data corresponding to the match signals from the AND CAM cell array block in the match mode, a second address module for, in the write mode, generating sequential addresses and supplying the generated sequential addresses to the OR CAM cell array block, and an output module for transferring the output data from the OR CAM cell array block externally in the match mode. The reprogrammable programmable logic array further comprises a buffer module for buffering the match signals from the AND CAM cell array block.

2 Claims, 4 Drawing Sheets

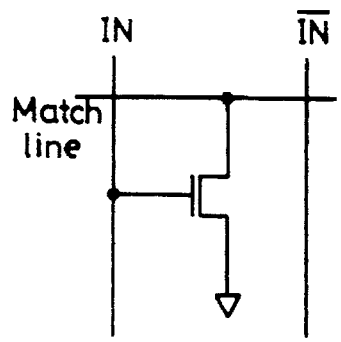 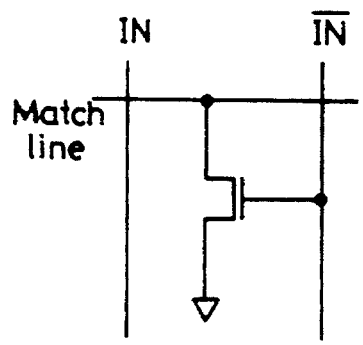 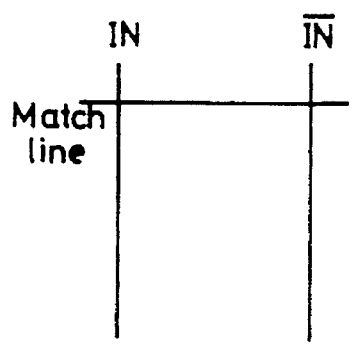
Fig. 1A    Fig. 1B    Fig. 1C
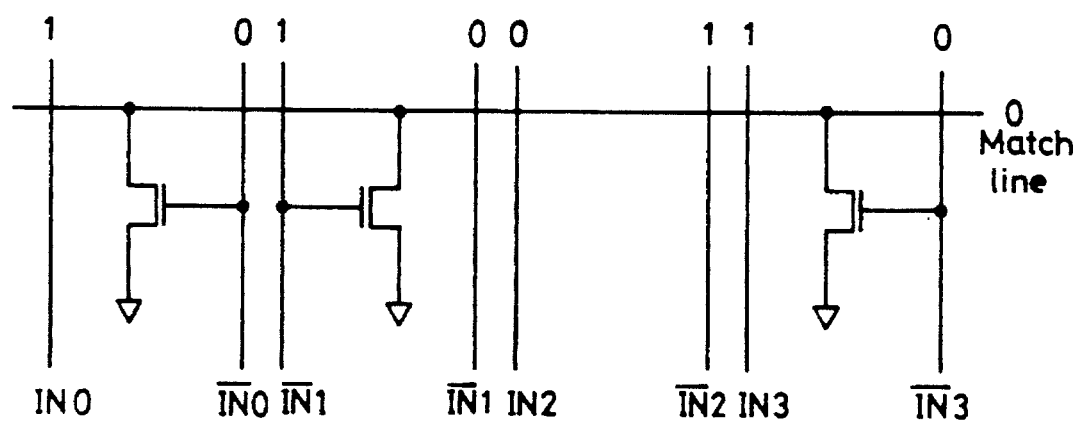
Fig. 2

REPROGRAMMABLE PROGRAMMABLE LOGIC ARRAY

BACKGROUND OF THE INVENTION

1. Field of the Invention

The present invention relates in general to a programmable logic array (referred to hereinafter as PLA) used as a logic circuit in a digital system, and more particularly to a reprogrammable PLA which can be readily manufactured and integrated.

2. Description of the Prior Art

All digital logic circuits can be designed in a table lockup manner with respect to input and output. For example, a read only memory (referred to hereinafter as ROM) and a PLA are mainly used in the design of the table lookup manner. The ROM allows only "1" and "0" as the table contents, whereas the PLA allows a don't care as well as "1" and "0" as the table contents. For example, a 2-input NAND gate function can be implemented by using the ROM and the PLA, as follows:

TABLE 1

| ROM | | PLA | | |
|---|---|---|---|---|
| INPUT | OUTPUT | INPUT | | OUTPUT |
| 0 0 | 0 | 0 | X | 1 |
| 0 1 | 1 | X | 0 | 1 |
| 1 0 | 1 | 1 | 1 | 0 |
| 1 1 | 1 | | | |

As seen from the above table 1, the ROM must form the table with respect to all input cases because it does not allow a don't care as the input. Because allowing the don't care as the input, the PLA forms the table with contents of a number smaller than that of the ROM to perform the same function as that of the ROM. As a result, the PLA can readily be logic-designed in most cases by employing a hardware smaller in scale than that of the ROM. In this connection, the PLA is used as one of the logic integrated circuit (referred to hereinafter as IC) design manners. As semi-custom manners for designing the IC, there are a gate array manner, a standard cell manner and a programmable logic device (referred to hereinafter as PLD) manner. The design manner using the PLD provides the following advantages.

First, the system design requires no level lower than a logic gate level because control functions and data paths are directly compiled into a PLD description.

Second, in the case of using a reprogrammable PLD, an error can be corrected at a protype stage with no waste of cost.

Third, the design speed is very high.

Fourth, because signals are freely assigned to pins, it becomes simple to design a printed circuit board (PCB). The use of the reprogrammable PLD makes it easy to change or replace the existing functions.

Because of these advantages, the reprogrammable PLD has been deeply studied and has sold well on the market. The PLD includes a programmable read only memory (referred to hereinafter as PROM) cell, an erasable programmable read only memory (referred to hereinafter as EPROM) cell or an electrically erasable programmable read only memory (referred to hereinafter as EEPROM) cell to establish the reprogrammable operation. Alternatively, because of the above-mentioned design advantages, as a programmable device of the gate array type, a field programmable gate array (FPGA) device or an electrically configurable gate array (ECGA) device is mainly used for hardware emulation. However, such devices have a disadvantage in that they require a particular process in addition to a general CMOS process. Also, the reprogrammable PLD cannot have a capacity exceeding several thousand-gate class, because of limitations in structure and technique.

SUMMARY OF THE INVENTION

Therefore, the present invention has been made in view of the above problems, and it is an object of the present invention to provide a reprogrammable PLA which can be readily manufactured and highly integrated through a general CMOS process.

In accordance with the present invention, the above and other objects can be accomplished by providing a reprogrammable programmable logic array comprising a first write module for inputting data to be written and data to be compared; an AND CAM cell array block for, in a write mode, sequentially storing the write data from said first write module and, in a match mode, comparing the comparison data from said first write module with its pre-stored data and generating match signals in accordance with the compared result; a first address module for, in the write mode, generating sequential addresses and supplying the generated sequential addresses to said AND CAM cell array block; a second write module for inputting data to be written in the write mode; an OR CAM cell array block for storing sequentially the write data from said second write module in the write mode and detecting its pre-stored data corresponding to the match signals from said AND CAM cell array block in the match mode; a second address module for, in the write mode, generating sequential addresses and supplying the generated sequential addresses to said OR CAM cell array block; and an output module for transferring the output data from said OR CAM cell array block externally in the match mode.

BRIEF DESCRIPTION OF THE DRAWINGS

The above and other objects, features and advantages of the present invention will be more clearly understood from the following detailed description taken in conjunction with the accompanying drawings, in which:

FIGS. 1A to 1C are circuit diagrams illustrating the operations of content addressable memory cells;

FIG. 2 is a circuit diagram illustrating an unmatch operation of four content addressable memory cells;

DETAILED DESCRIPTION OF THE PREFERRED EMBODIMENTS

As seen from table 1, the ROM inputs an address and outputs the contents corresponding to the inputted address. The PLA may be recognized in a similar manner to the ROM. However, it should be noted in view of hardware that the PLA detects an address matched with the input, because of a don't care bit. Further, one or more match addresses are present with respect to one input combination in the PLA, whereas one match address is present with respect to one input combination in the ROM.

In table 1, two addresses are required with respect to the inputs of "0,0", whereas one output with a logic value of "1" is required with respect to the inputs of "0,1" and "1,0". The PLA performs an AND operation with respect to the inputs and an OR operation with respect to the outputs.

In the case where the AND operation is performed by the PLA under the conception of match, logic values can be obtained with respect to a 1-bit input by circuits shown in FIGS. 1A to 1C.

FIG. 1A shows the construction of a circuit when the 1-bit input has a logic value of "0", FIG. 1B shows the construction of a circuit when the 1-bit input has a logic value of "1" and FIG. 1C shows the construction of a circuit when the 1-bit input has a logic value of don't care.

In FIGS. 1A to 1C, a match line is precharged with a high logic value at the initial state. The match line is changed from high to low in logic when its logic value is equal to that of the 1-bit input IN or /IN.

FIG. 2 shows an unmatch state under the condition that a word has a logic value of "10×1" and an input has a logic value of "1101". The second complementary bit has a logic value of "0" different from a logic value of "1" on a match line and the second true bit has a logic value of "1". As a result, the match line outputs a logic value of "0". In this manner, the PLA can be embodied with a circuit for performing the OR operation. As mentioned above, the PLA can be regarded as the connection of circuits of two blocks with the match function. The use of content addressable memory (referred to hereinafter as CAM) cells under the match conception enables the PLA to be reprogrammably embodied.

Figure 3A:
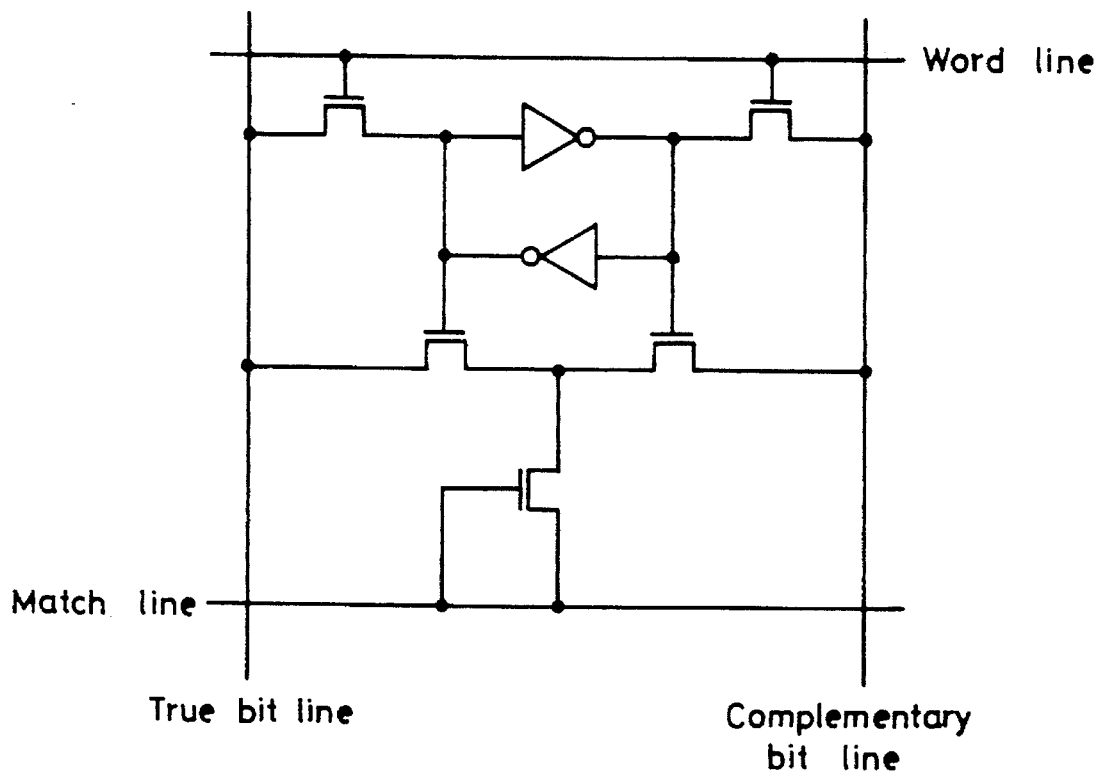
FIG. 3A is a circuit diagram of a static content addressable memory cell.
Figure 3B:
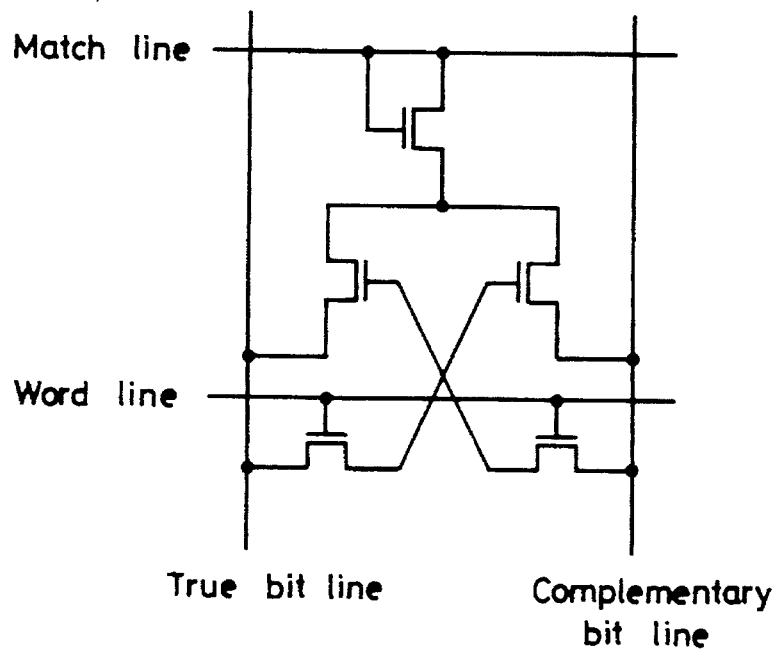
FIG. 3B is a circuit diagram of a dynamic content addressable memory cell.

FIGS. 3A and 3B are circuit diagrams of static and dynamic CAM cells which may be used in the PLA, respectively. Each of the static and dynamic CAM cells can store a logic value of "1" or "0" through a general write process at the initial state. In this case, a word line is high in logic, and true and complementary bin lines are applied with data (or address) corresponding to the logic value to be written.

During a match operation, true and complementary data to be compared are applied to the true and complementary bit lines, respectively. A match line has a logic value of "0" or "1" in accordance with the matched result. The static and dynamic CAM cells in FIGS. 3A and 3B are discriminated between each other according to a don't care processing capability. Generally, the static CAM cell is unable to process the don't care. In the case where the dynamic CAM cell of FIG. 3B is to be programmed under the don't care condition, the true and complementary bit lines are applied with data with a logic value of "0" in a write mode.

In the case of embodying the PLA using the CAM, an AND operator requires a CAM cell capable of performing the comparison of logic values of "don't care", "0" and "1", and an OR operator requires a CAM cell capable of performing the comparison of logic values of "don't care" and "0".

Figure 4:
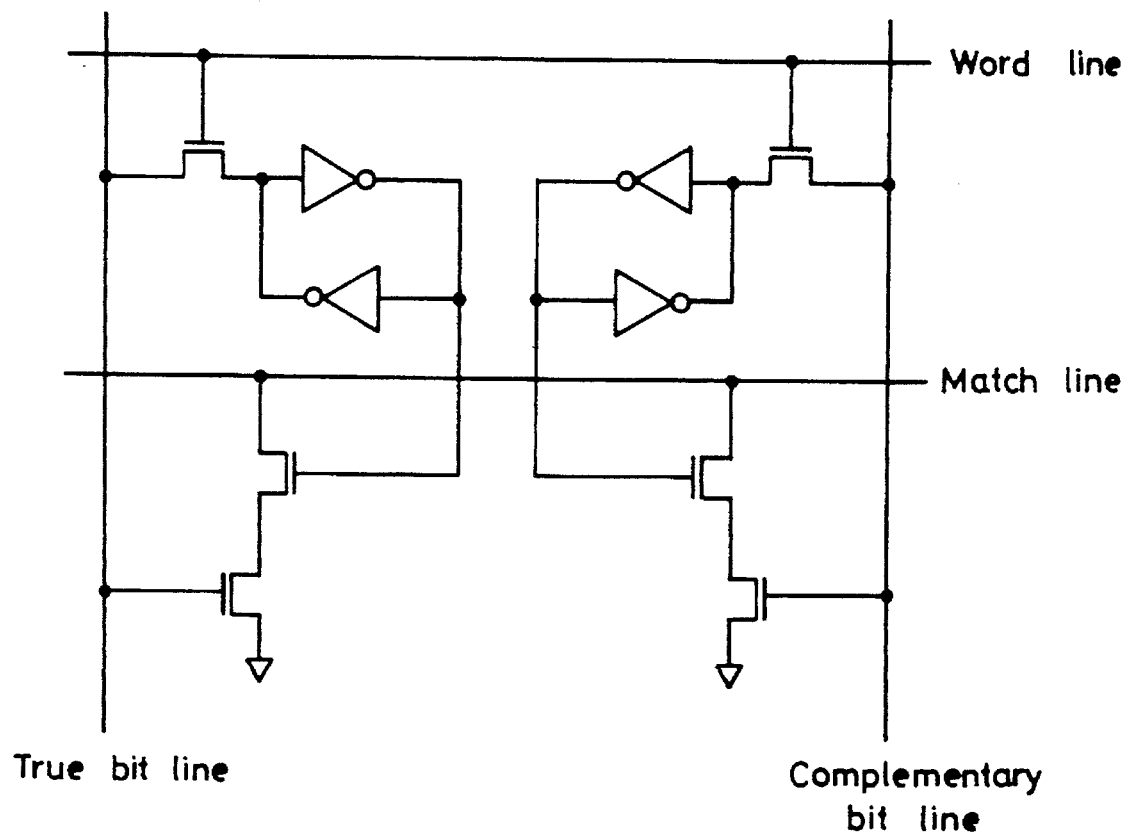
FIG. 4 is a circuit diagram of a maskable static content addressable memory cell.

FIG. 4 is a circuit diagram of a maskable CAM cell including four inverters. In this drawing, each of two inverters circulating loops forms one static random access memory (referred to hereinafter as SRAM) cell with one NMOS transistor. In the maskable CAM cell, in order to process a logic value of "don't care", true and complementary bit data with a logic value of "1" are applied to true and complementary bit lines and then stored into the two SRAM cells, respectively.

Figure 5:
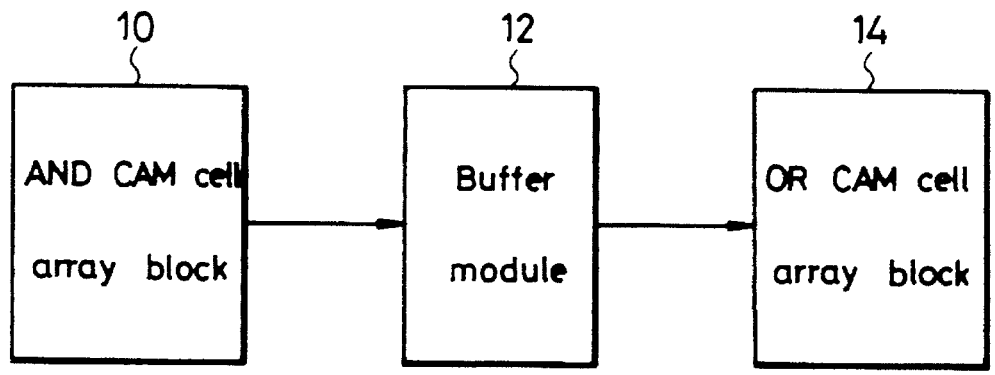
FIG. 5 is a block diagram schematically illustrating a reprogrammable PLA of the present invention.

Referring to FIG. 5, there is schematically shown a reprogrammable PLA of the present invention. As shown in this drawing, the reprogrammable PLA comprises an AND CAM cell array block 10, a buffer module 12 and an OR CAM cell array block 14 connected in series. Each of the AND CAM cell array block 10 and the OR CAM cell array block 14 includes a plurality of maskable CAM cells, each of which is shown in FIG. 4. Also, the AND CAM cell array block 10 and the OR CAM cell array block 14 store divided parts of a PLA table, respectively.

The AND CAM cell array block 10 is adapted to AND its stored logic values and input logic values and generate match signals with logic values of "0" or "1" in accordance with the AND-matched result. The match signals from the AND CAM cell array block 10 are transferred to the OR CAM cell array block 14 through the buffer module 12. Then, the OR CAM cell array block 14 performs an OR match operation in a similar manner to the AND match operation of the AND CAM cell array block 10.

The operation of the reprogrammable PLA in FIG. 5 will hereinafter be described in detail with reference to the PLA table in table 1.

The AND CAM cell array block 10 at the input stage has two inputs and three products. To this end, the AND CAM cell array block 10 includes six CAM cells. In the AND CAM cell array block 10, the maskable CAM cells store the logic values in table 1, respectively. Namely, if the logic values in table 1 are "1", the maskable CAM cells store logic values of "1". On the contrary, if the logic values in table 1 are "0", the maskable CAM cells store logic values of "0". When the logic values in table 1 are "don't care", the maskable CAM cells store true and complementary data which are both "1".

In the OR CAM cell array block 14, the maskable CAM cells are programmed to process the don't care condition when input logic values are "0". On the contrary, the maskable CAM cells are programmed to store logic values of "0" when the input logic values are "1". At this time, the OR CAM cell array block 14 inverts its output signal.

When the inputs in table 1 are 0,x or x,0, either the first or second product result is "1". Because of the unmatched OR operation, a match line of the OR CAM cell array block 14 outputs a logic value of "0", which results from the above logic value of "1" being inverted by an inversion logic circuit in the OR CAM cell array block 14. If the inputs in the table 1 are 1,1, the OR CAM cell array block 14 recognizes that the input logic values are matched with its stored logic values, and generates a logic value of "1" in accordance with the recognized result. The logic value of "1" as a result of the OR operation is inverted into "0", which is equal to the output value of the PLA in table 1.

In the case where a cell array is large in scale, sensor circuits may be connected to the match lines of the AND CAM cell array block 10 and the OR CAM cell array block 14, respectively, to increase the operating speed. The reprogrammable PLA has an advantage in that it is operated in a PLA manner by writing "0" into all OR CAM cells. Therefore, the reprogrammable PLA can be applied to all tables of the PLA type and the PAL type. Also, a program debugging operation is enabled by reading the contents from the programmed CAM cells. With the reprogrammable PLA embodied using the static or dynamic CAM cells as mentioned above, a system may comprise a nonvolatile memory such as an EPROM or an EEPROM at the outside of the PLA. Also, the system may comprise a processor such as a main control unit (MCU), for writing program data into the CAM cells. The data write procedure in the AND operation is in accord with that of a general SRAM or DRAM. In this case, the word line addressing is performed by sequentially accessing product lines. Because of no necessity for performing a random accessing operation required in a general memory, the sequential addressing operation makes the data write procedure simple in the view of hardware. The comparison data is applied to the bit line in the match operation in a similar manner to that in which the write data is applied to the bit line in the write mode. As a result, the same input circuit can be used in the match and write operations.

Figure 6:
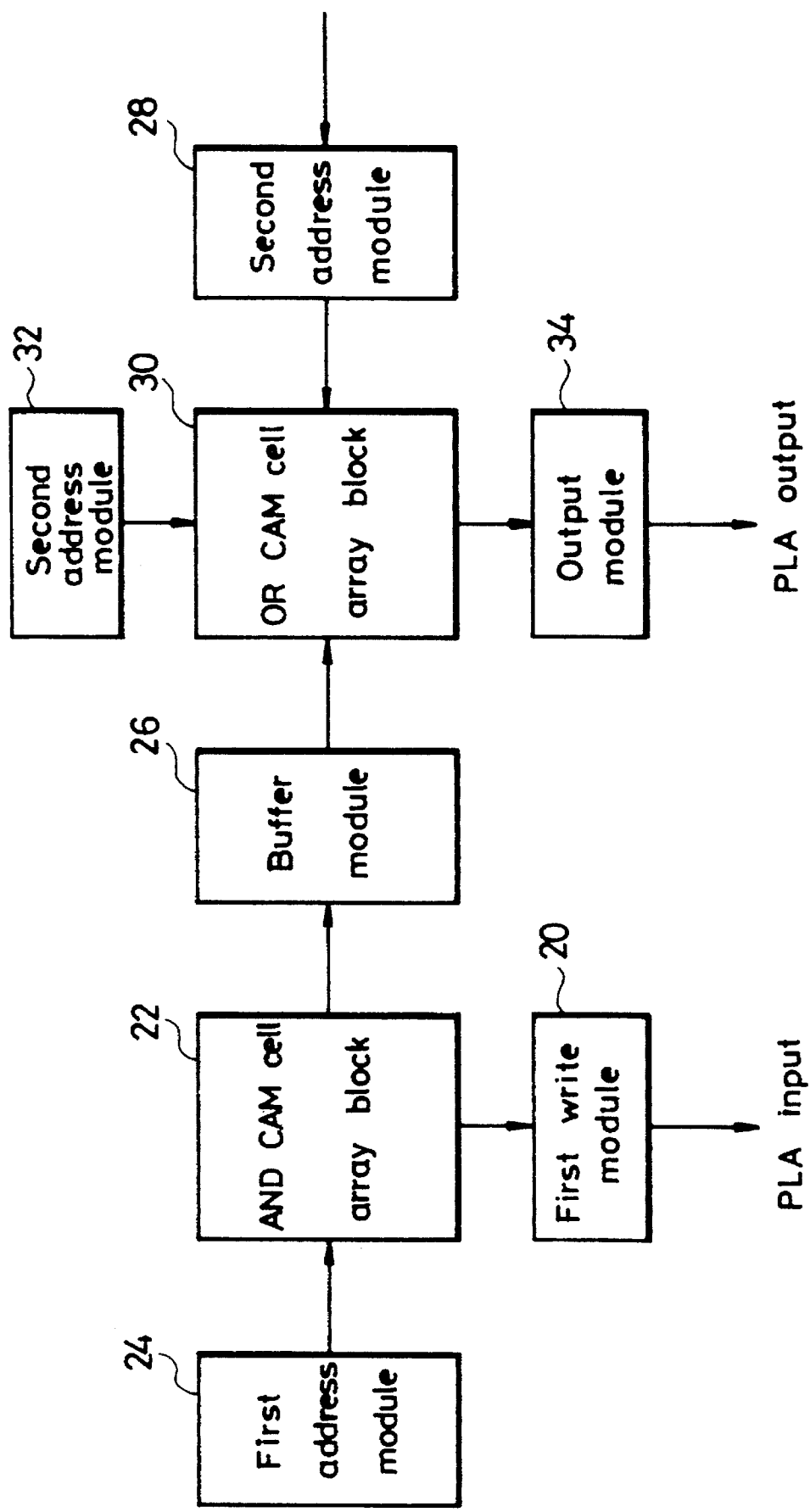
FIG. 6 is a block diagram of the reprogrammable PLA in accordance with an embodiment of the present invention.

Referring to FIG. 6, there is shown a block diagram of the reprogrammable PLA in accordance with an embodiment of the present invention. As shown in this drawing, the reprogrammable PLA comprises a first write module 20, an AND CAM cell array block 22, a first address module 24 and a buffer module 26. The first write module 20 is adapted to input data to be written into the AND CAM cell array block 22 and data to be compared by the AND CAM cell array block 22. In a write mode, the AND CAM cell array block 22 stores sequentially the write data from the first write module 20. In a match mode, the AND CAM cell array block 22 compares the comparison data from the first write module 20 with its pre-stored data and generates match signals in accordance with the compared result. In the write mode, the first address module 24 generates sequential addresses and supplies the generated sequential addresses to the AND CAM cell array block 22 so that the write data from the first write module 20 can sequentially be stored into memory locations of the AND CAM cell array block 22. The buffer module 26 is adapted to buffer the match signals from the AND CAM cell array block 22. The reprogrammable PLA further comprises a second write module 28, an OR CAM cell array block 30, a second address module 32 and an output module 34. The second write module 28 is adapted to input data to be written into the OR CAM cell array block 30. In the write mode, the OR CAM cell array block 30 stores sequentially the write data from the second write module 28. In the match mode, the OR CAM cell array block 30 outputs data stored in its memory locations corresponding to the match signals from the buffer module 26 to the output module 34. In the write mode, the second address module 32 generates sequential addresses and supplies the generated sequential addresses to the OR CAM cell array block 30 so that the write data from the second write module 28 can sequentially be stored into the memory locations of the OR CAM cell array block 30. Finally, the output module 34 amplifies the data from the OR CAM cell array block 30 and outputs the amplified data externally.

Noticeably, the OR CAM cell array block 30 must be programmed in a different manner from the AND CAM cell array block 22 because its bit lines have to input the match signals from the AND CAM cell array block 22. In the case where the bit lines are to be used in the write mode, the data write operation can be performed with a bit width corresponding to the number of AND operations of the AND CAM cell array block 22 when the AND operations are small in number. If the AND operations of the AND CAM cell array block 22 are large in number, a word line impedance is increased because the number of bits of one word may be in accord with that of the AND operations. This can be overcome by using a proper write driver or metal-stripping the word line. Also, the reprogrammable PLA does not require a high write speed in application. In the match operation following the write operation of the OR CAM cell array block 30, the match signals generated by the AND operations of the AND CAM cell array block 22 are transferred to bits lines of OR operations of the OR CAM cell array block 30. As a result, the output from the second write module 28 to the OR CAM cell array block 30 must have a high impedance. The buffer module 26 is used for a reduction in speed or noise. If the AND CAM cell array block 22 is small in size, the buffer module 26 may not be used. The output module 34 functions to sense and amplify the data from the OR CAM cell array block 30. The output module 34 is influenced by a clocking operation of the CAM and may be modified.

The first and second write modules 20 and 28 and the first and second address modules 24 and 32 are enabled at the initial write mode, whereas the first and second address modules 24 and 32 and the second write module 28 are disabled at the match mode.

As apparent from the above description, according to the present invention, the reprogrammable PLA can be embodied through a general CMOS process with no use of a particular process. Also, the reprogrammable PLA of the present invention is simple in construction and utilizes the existing standard PLA format directly, thereby allowing the associated software to be readily developed. Further, the reprogrammable PLA of the present invention has a very high operating speed and a high integration. Therefore, the reprogrammable PLA of the present invention can be applied as a PLD structure requiring many gates.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A reprogrammable programmable logic array comprising:

a first write module for inputting data to be written and data to be compared;

an AND CAM cell array block for, in a write mode, sequentially storing the write data from said first write module and, in a match mode, comparing the comparison data from said first write module with its pre-stored data and generating match signals in accordance with the compared result;

a first address module for, in the write mode, generating sequential addresses and supplying the generated sequential addresses to said AND CAM cell array block;

a second write module for inputting data to be written in the write mode;

an OR CAM cell array block for storing sequentially the write data from said second write module in the write mode and detecting its pre-stored data corresponding to the match signals from said AND CAM cell array block in the match mode;

a second address module for, in the write mode, generating sequential addresses and supplying the generated sequential addresses to said OR CAM cell array block; and an output module for transferring output data from said OR CAM cell array block externally in the match mode.

2. A reprogrammable programmable logic array as set forth in claim 1, further comprising a buffer module connected between said AND CAM cell array block and said OR CAM cell array block, for buffering the match signals from said AND CAM cell array block and outputting the buffered match signals to said OR CAM cell array block.

* * * * *